US010211811B2

(12) United States Patent
Gramegna

(10) Patent No.: US 10,211,811 B2
(45) Date of Patent: Feb. 19, 2019

(54) TUNABLE FILTER

(71) Applicant: HUAWEI TECHNOLOGIES CO., LTD., Shenzhen (CN)

(72) Inventor: Giuseppe Gramegna, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/906,791

(22) Filed: Feb. 27, 2018

(65) Prior Publication Data

US 2018/0248538 A1 Aug. 30, 2018

Related U.S. Application Data

(63) Continuation of application No. PCT/EP2016/060769, filed on May 12, 2016.

(51) Int. Cl.
*H03B 1/00* (2006.01)
*H03K 5/00* (2006.01)
(Continued)

(52) U.S. Cl.
CPC ......... *H03H 11/1291* (2013.01); *H03F 1/086* (2013.01); *H03F 3/4508* (2013.01); *H03H 11/1278* (2013.01)

(58) Field of Classification Search
CPC .. H03K 5/1252; H03K 19/00361; G06F 1/04; H04B 2215/064; H04B 2215/067
(Continued)

(56) References Cited

U.S. PATENT DOCUMENTS 6,225,859 B1 * 5/2001 Irvine .................... H03H 11/04
327/552
6,618,579 B1 9/2003 Smith et al.
(Continued)

FOREIGN PATENT DOCUMENTS

EP 077319 A1 6/1996
EP 0768755 A1 4/1997
EP 2263313 B1 12/2012

OTHER PUBLICATIONS

Mohammed Abdulaziz et al, "A 3.4mW 65nm CMOS 5th Order Programmable Active-RC Channel Select Filter for LTE Receivers," Radio Frequency Intergrated Circuits Symposium(RFIC), 2013 IEEE, RMO4A-2, XP032443942, Lund University, Lund, Sweden, Jun. 2, 2013, pp. 217-220.
(Continued)

*Primary Examiner* — Quan Tra
(74) *Attorney, Agent, or Firm* — Leydig, Voit & Mayer, Ltd.

(57) ABSTRACT

The disclosure relates to a tunable filter. The tunable filter includes: a filter input; a filter output; at least one feedback loop coupled between the filter output and the filter input, where the at least one feedback loop includes at least one tunable feedback capacitance which is configured to tune a cut-off frequency of the tunable filter; and an active element, coupled between the filter input and the filter output and configured to drive the at least one tunable feedback capacitance, the active element having a transfer function with a primary pole and at least one secondary pole, where the active element includes a first stabilization element that is coupled to a first internal node of the active element.

20 Claims, 10 Drawing Sheets

(51) Int. Cl.
*H04B 1/10* (2006.01)
*H03H 11/12* (2006.01)
*H03F 3/45* (2006.01)
*H03F 1/08* (2006.01)

(58) Field of Classification Search
USPC .................................................. 327/551–559
See application file for complete search history.

(56) References Cited

U.S. PATENT DOCUMENTS

| | | | |
|---|---|---|---|
| 7,050,781 B2 * | 5/2006 | Khalil | H04B 1/28 327/553 |
| 2002/0101279 A1 | 8/2002 | Greitschus et al. | |
| 2003/0222716 A1 * | 12/2003 | Kumeta | H03F 3/45197 330/253 |
| 2004/0227573 A1 * | 11/2004 | Soda | H03F 3/45381 330/253 |
| 2008/0100373 A1 | 5/2008 | Terryn et al. | |
| 2008/0157874 A1 | 7/2008 | Lin | |
| 2008/0284490 A1 | 11/2008 | Tenbroek | |
| 2013/0135503 A1 | 5/2013 | Park et al. | |
| 2014/0035667 A1 | 2/2014 | Soe | |

OTHER PUBLICATIONS

"HA17741/PS General-Purpose Operational Amplifier (Frequency Compensated)", Hitachi, Ltd. Semiconductor & Integrated Circuits., URL: http://phys.thu.edu.tw/~mengwen/exp-electronics/datasheet/HA17741.pdf, XP055074968, Japan, Jan. 1, 1998, pp. 1-18.

International Search Report and Written Opinion issued in corresponding International Application No. PCT/EP2016/060769, dated Feb. 14, 2017, 17 pages.

* cited by examiner

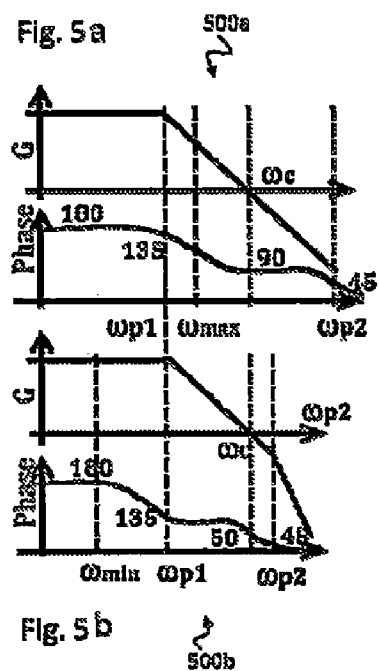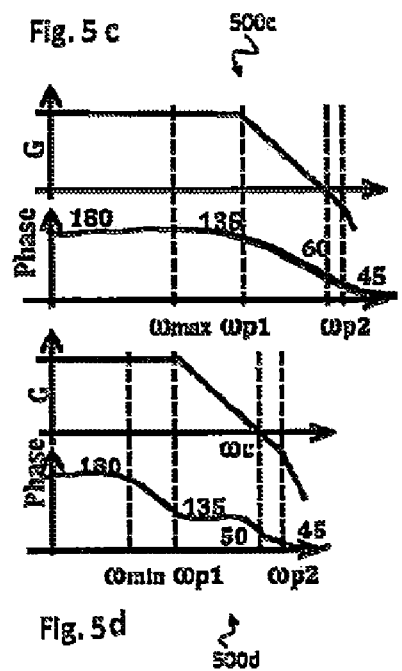

TUNABLE FILTER

CROSS-REFERENCE TO RELATED APPLICATIONS

This application is a continuation of International Application No. PCT/EP2016/060769, filed on May 12, 2016, the content of which is hereby incorporated by reference in its entirety for all purposes.

TECHNICAL FIELD

The present disclosure relates to a tunable filter and an apparatus and a method that are related to the tunable filter.

BACKGROUND

A tunable filter may be designed as a closed loop analogue circuit where the output load can change over a wide range. The disclosure further relates to adaptive stability compensation for wide tuning range filters. Filter with programmable cut-off frequency fo (between fo_min and fo_max) are implemented with variable capacitances C1, C2 or resistances R1, R2, R3 as shown in FIG. 1 illustrating a multi-feedback (MFB) low pass filter 100 with a closed loop DC coupled operational amplifier (OPAMP) 101.

The MFB filter 100 includes an operational amplifier 101 having a first (non-inverse, +) input 111, a second (inverse, −) input 112, a first (non-inverse, +) output 121, a second (inverse, −) output 122. A first feedback path including capacitance C1 is coupled between output 122 and input 111. A second feedback path including capacitance C1 is coupled between output 121 and input 112. A third feedback path including resistors R2 and R3 is coupled in parallel to the first feedback path between output 122 and input 111. A fourth feedback path including resistors R2 and R3 is coupled in parallel to the second feedback path between output 121 and input 112. The first (non-inverse, +) input voltage VIN+ is coupled via resistor R1 and the resistor R3 of the third feedback path to the first input 111. The second (inverse, −) input voltage VIN− is coupled via resistor R1 and the resistor R3 of the fourth feedback path to the second input 112. An input loop including the resistors R3 of the third and fourth feedback paths and a further capacitance C2/2 is coupled between the inputs 111, 112.

Generally, it is preferred to program capacitances since in this way Q-factor and noise performances are kept constant versus operating frequency. The operational amplifier (OPAMP) 101 used in the filter 100 has to drive those capacitances C1, C2. In case the fo tuning range is very large, the ratio between maximum and minimum capacitances (Cmax/Cmin) is high, therefore the OPAMP 101 has to cope with very different loading conditions.

FIG. 2 illustrates a possible realization of the RC Filter 100 depicted in FIG. 1 together with its OPAMP 101. The OPAMP 101 may include a non-inverse input path between a drive voltage VDD and ground GND including a first (non-inverse) current source MP+, a first (non-inverse) transistor Q1+ and a second current source (non-inverse) Iin+. A control terminal of Q1+ is coupled to the first input 111 of the OPAMP 101. The OPAMP 101 includes an inverse output path between a drive voltage VDD and ground GND including a second (inverse) transistor QF− and a third current source (inverse) Iout−. A control terminal of QF− is coupled to a first (non-inverse) node D+ of the OPAMP which is located between MP+ and Q1+. A first terminal of QF− is coupled to the second output 122 (VOUT−) of the OPAMP 101. A second terminal of QF− is coupled to the drive voltage VDD. The above described components are additionally used in inverse form as described in the following.

The OPAMP 101 further includes an inverse input path between a drive voltage VDD and ground GND including a first (inverse) current source MP−, a first (inverse) transistor Q1− and a second (inverse) current source Iin−. A control terminal of Q1− is coupled to the second input 112 of the OPAMP 101. The OPAMP 101 includes a non-inverse output path between a drive voltage VDD and ground GND including a second (non-inverse) transistor QF+ and a third (non-inverse) current source Iout+. A control terminal of QF+ is coupled to a first (inverse) node D− of the OPAMP 101 which is located between MP− and Q1−. A first terminal of QF+ is coupled to the first output 121 (VOUT+) of the OPAMP 101. A second terminal of QF+ is coupled to the drive voltage VDD.

A capacitance Cs and a resistor Rs are coupled in parallel between the first terminal of Q1+ and the first terminal of Q1−.

Note that the OPAMP 101 can alternatively be realized as a differential OPAMP as depicted in FIG. 2 or alternatively as a non-differential OPAMP. The non-differential OPAMP 101 has only one first current source MP, one first transistor Q1, one second current source Iin, one third current source Iout, one input and one output without the differentiation of non-inverse and inverse components.

For the specific case of a Multiple Feedback Amplifier (MFB), equations that set the operating frequency, gain H(s) and quality factor of the Filter Q (i.e. its shape) are reported in the following.

$$H(s) = \frac{-R_2/R_1}{1 + s/(Q\omega_o) + (s/\omega_o)^2}$$

$$\omega_o = \frac{1}{\sqrt{C_1 C_2 R_2 R_3}}$$

$$Q = \sqrt{\frac{C_2}{C_1}} \frac{\sqrt{R_2 R_3}}{R_2 + R_3\left(1 + \frac{R_2}{R_1}\right)}$$

In the case that the filter 100 needs to operate at different frequencies, C2 and C1 capacitance are varied in such a way that 1) for a maximum cutoff frequency fo_max, C2 and C1 are set at minimum value; and that 2) for a Minimum cutoff frequency fo_min, C2 and C1 are set at maximum value.

FIG. 3 illustrates the OPAMP 101 of FIG. 2 with its equivalent RC load. In the OPAMP 101 capacitances between first internal nodes D+, D− and drive voltage VDD are referred to as Co. C2 and C1 are seen by OPAMP 101 as an equivalent capacitance CL at the node VOUT (i.e. VOUT−, VOUT+) as illustrated in FIG. 3 and for sake of simplicity CL_max and CL_min are defined as the equivalent maximum and minimum equivalent capacitances at node VOUT (i.e. VOUT−, VOUT+) in the two extreme cases fo_min (ωmin) and fo_max (ωmax).

The filter 100 is a system in closed loop around its OPAMP 101: in order to have the filter insensitive to OPAMP 101 parameters, open loop gain has to be high at cutoff frequency fo. This requires a minimum gain-bandwidth-product (GBW). So minimum required GBW_MIN is set by maximum frequency fo_max.

As far as OPAMP 101 open loop gain is considered, assuming that the primary pole (dominant pole, or $1^{st}$ pole)

is located at the nodes D+, D− (output of $1^{st}$ stage), the equivalent capacitance CL set the position of secondary poles S+, S− of the OPAMP 101, hence its stability. The fact that C1 and C2 (hence CL) can have very different values during filter operation makes the problem of OPAMP stability a big challenge and imposes a trade-off on the maximum Gain*Bandwidth (GBW) product of the OPAMP 101 and the Filter tuning range.

To summarise, in a closed Loop Filter there is an intrinsic trade-off between fo_max and tuning range as illustrated in FIGS. 4*a* and 4*b*. This is due to the fact that: 1) the minimum required GBW=Goamp*ωp1 product is imposed by fo_max (operating frequency) as shown in FIG. 4*a*. In fact the OPAMP used into the filter needs to have large open loop gain (Gopamp) at fo_max. 2) The maximum allowed GBW=Goamp*ωp1 product is limited by fo_min as shown in FIG. 4*b*. In fact, the $2^{nd}$ pole (wp2) is set by Cmax (when Filter works at fo_min) and the stability condition dictates that ωp2/ωc=3 to have 70 degree phase margin, where ωc is the frequency where Goamp=0. This means that the location of the primary pole is set by the case when the Filter operates at fo_min, thus GBW product will be limited also when Filter is operated at fo_max.

This characteristics is illustrated in FIGS. 4*a* and 4*b*. FIGS. 5*a*, 5*b* are examples of frequency diagrams that correspond to FIGS. 4*a*, 4*b*. FIGS. 5*c*, 5*d* show frequency diagrams of a tunable filter according to the disclosure which removes the trade-off between gain bandwidth products versus Cmax/Cmin tuning ranges.

SUMMARY

The present disclosure provides a tunable filter, an apparatus that has the tunable filter and a method of making the tunable filter.

According to a first aspect of the present disclosure, a tunable filter is provided. The tunable filter may include a filter input; a filter output; at least one feedback loop coupled between the filter output and the filter input, where the at least one feedback loop includes at least one tunable feedback capacitance which is configured to tune a cut-off frequency of the tunable filter; and an active element, coupled between the filter input and the filter output and configured to drive the at least one tunable feedback capacitance, the active element having a transfer function with a primary pole and at least one secondary pole, where the active element includes a first stabilization element that is coupled to a first internal node of the active element, where the first stabilization element is configured to establish a linear relationship between a location of the primary pole and a location of the at least one secondary pole of the active element.

According to a second aspect of the present disclosure, an apparatus is provided. The apparatus may include a tunable filter. The tunable filter may include a filter input; a filter output; at least one feedback loop coupled between the filter output and the filter input, where the at least one feedback loop includes at least one tunable feedback capacitance which is configured to tune a cut-off frequency of the tunable filter; and an active element, coupled between the filter input and the filter output and configured to drive the at least one tunable feedback capacitance, the active element having a transfer function with a primary pole and at least one secondary pole, where the active element includes a first stabilization element that is coupled to a first internal node of the active element, where the first stabilization element is configured to establish a linear relationship between a location of the primary pole and a location of the at least one secondary pole of the active element.

According to a third aspect of the present disclosure, a method of making a tunable filter is provided. The method may include providing a filter input, and a filter output; connecting at least one feedback loop between the filter output and the filter input, where the at least one feedback loop includes at least one tunable feedback capacitance which is configured to tune a cut-off frequency of the tunable filter; and connecting an active element between the filter input and the filter output, where the active element is configured to drive the at least one tunable feedback capacitance, and the active element has a transfer function with a primary pole and at least one secondary pole, where the active element includes a first stabilization element that is coupled to a first internal node of the active element, where the first stabilization element is configured to establish a linear relationship between a location of the primary pole and a location of the at least one secondary pole of the active element.

It should be understood that general descriptions above and detailed descriptions below are merely illustrative and explanatory without limiting the present disclosure.

BRIEF DESCRIPTION OF THE DRAWINGS

Examples of the disclosure are described with respect to the following figures, in which:

FIGS. 5*a*-5*d* show frequency diagrams;

DETAILED DESCRIPTION

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense.

It is understood that comments made in connection with a described device, circuit or system may also hold true for a corresponding method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

It is the object of the disclosure to provide an improved tuneable filter design providing large gain at cutoff frequency and wide and stable tuning range.

A basic idea of the disclosure is to break the limitation on MAX GBW product set by Cmax by moving the primary pole together with the secondary poles during frequency tuning.

In this way the following holds at CMIN (fo_max): Since ωp2 is at its highest frequency, location of pole ωp1 can be moved at higher frequencies (see FIG. 5c). In this condition the maximum possible GBW is achieved (is what is needed to operate at fo_max). At CMAX (fo_min) the following holds: Since ωp2 is at its lowest frequency, location of pole ωp1 can be moved at lower frequencies to improve stability (see FIG. 5d). In this condition GBW is reduced (for operation at fo_min, GBW can be reduced with respect to operation at fo_max).

In order to describe the disclosure in detail, the following terms, abbreviations and notations may be used:
OPAMP: Operational Amplifier;
fo_min: minimum cutoff frequency;
fo_max: maximum cutoff frequency;
MFB: Multiple Feedback;
Q: quality factor;
GBW: gain bandwidth product;
ωp1: primary pole or dominant pole;
ωp2: secondary pole(s).

Figure 1:
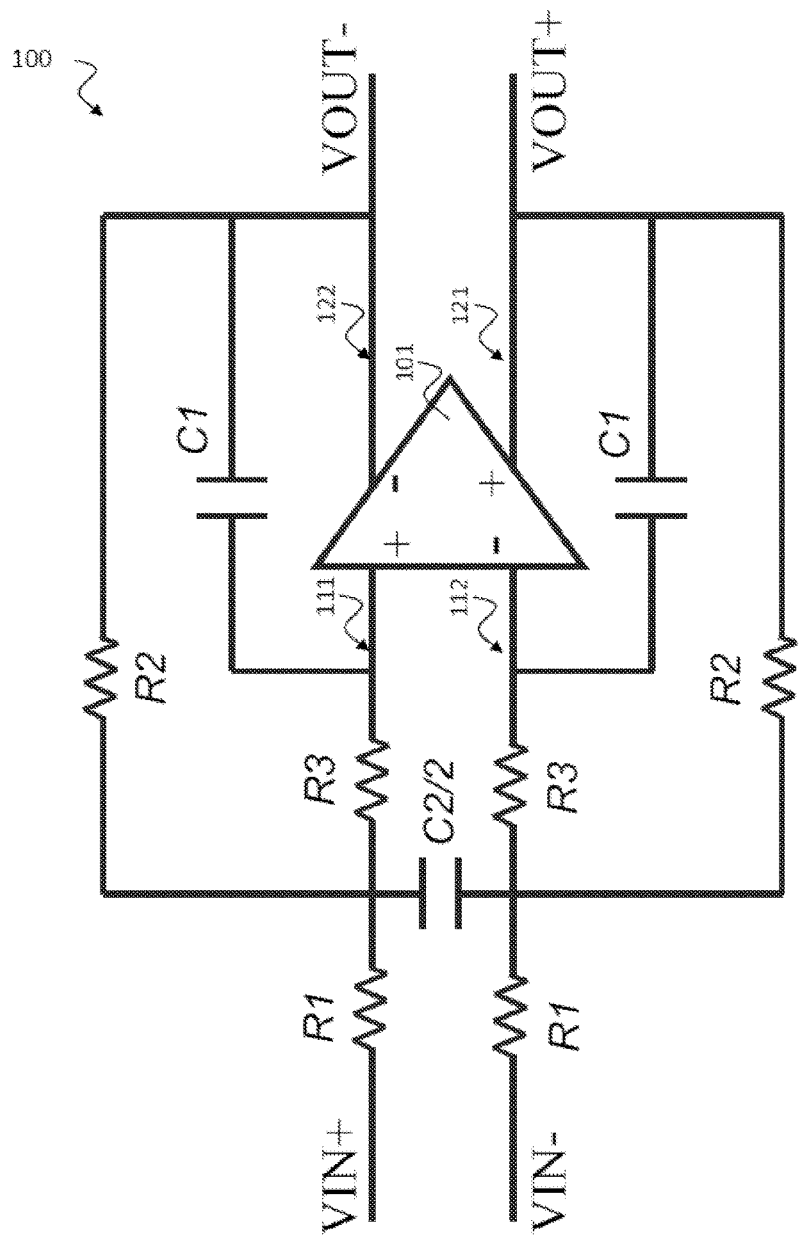
FIG. 1 shows a circuit diagram illustrating a MFB low pass filter 100.
Figure 2:
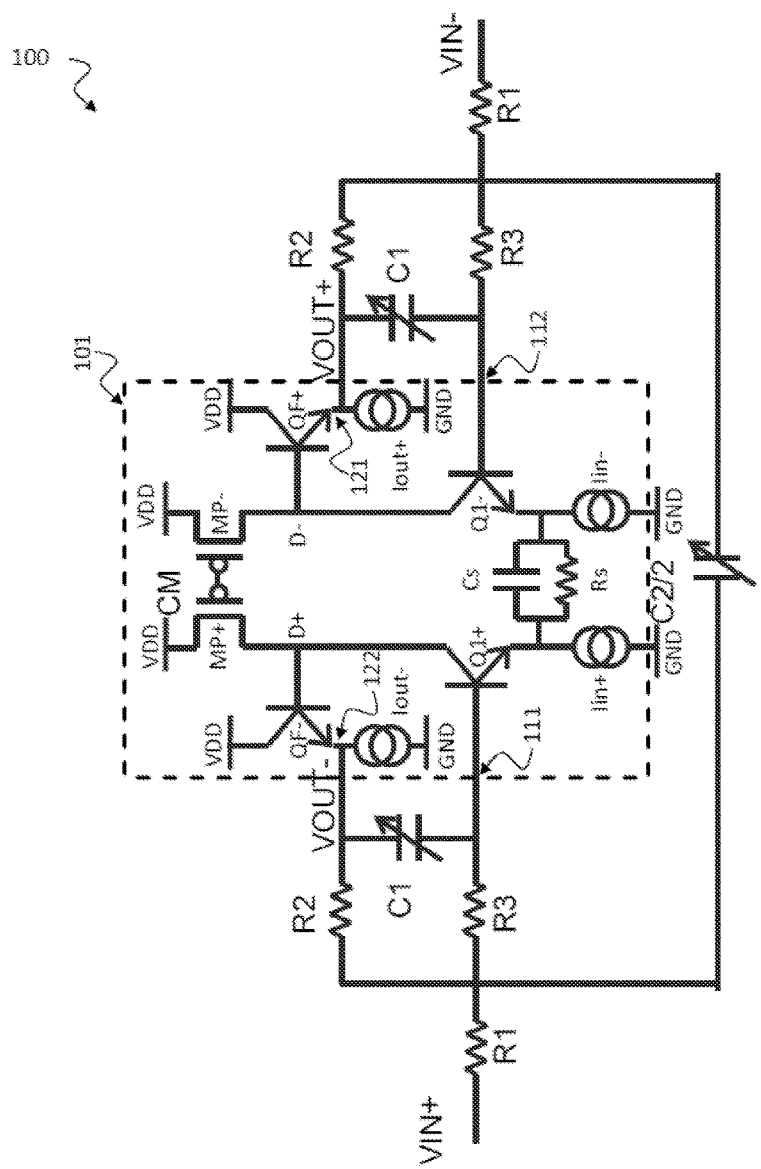
FIG. 2 shows a circuit diagram illustrating the MFB low pass filter 100 together with electrical components of the OPAMP.
Figure 3:
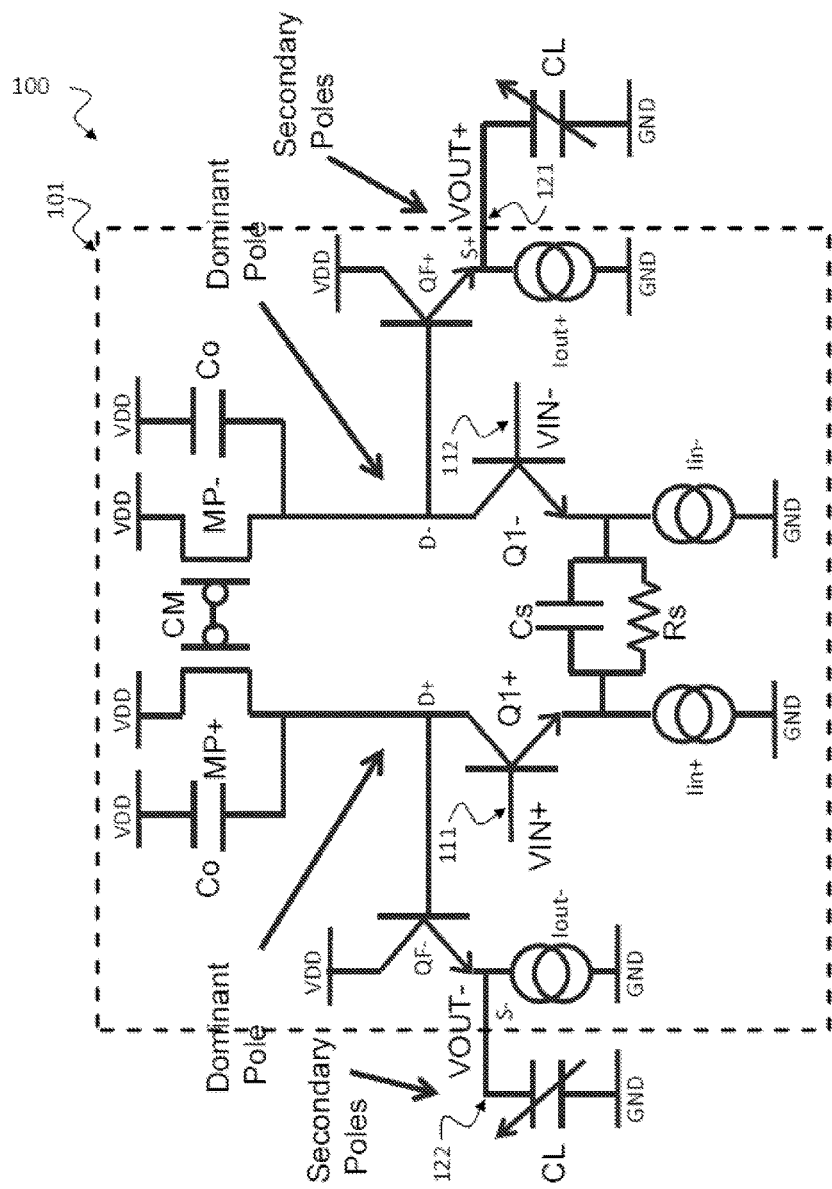
FIG. 3 shows a circuit diagram illustrating the MFB low pass filter 100 including internal capacitances Co.
Figure 4A:
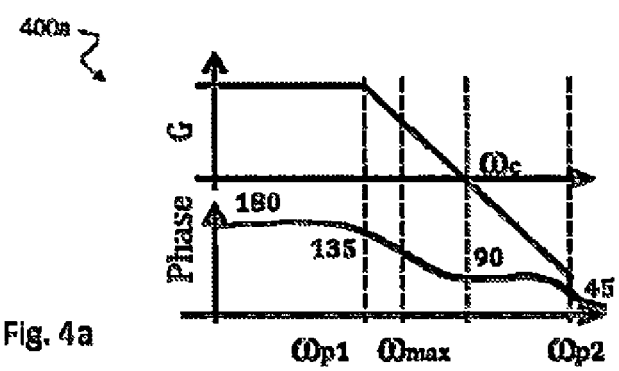
FIGS. 4*a*, 4*b* show frequency diagrams of the MFB low pass filter 100 illustrating trade-off between gain bandwidth products versus Cmax/Cmin tuning ranges.
Figure 4B:
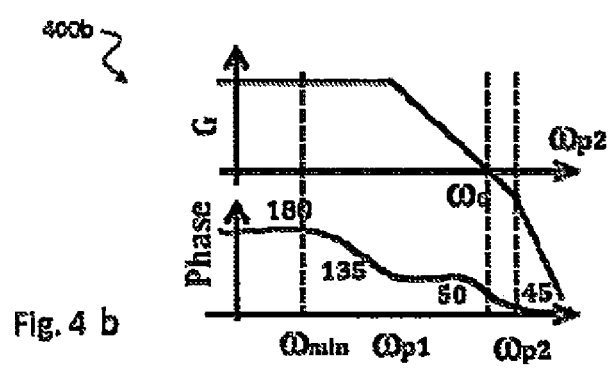
Figure 6:
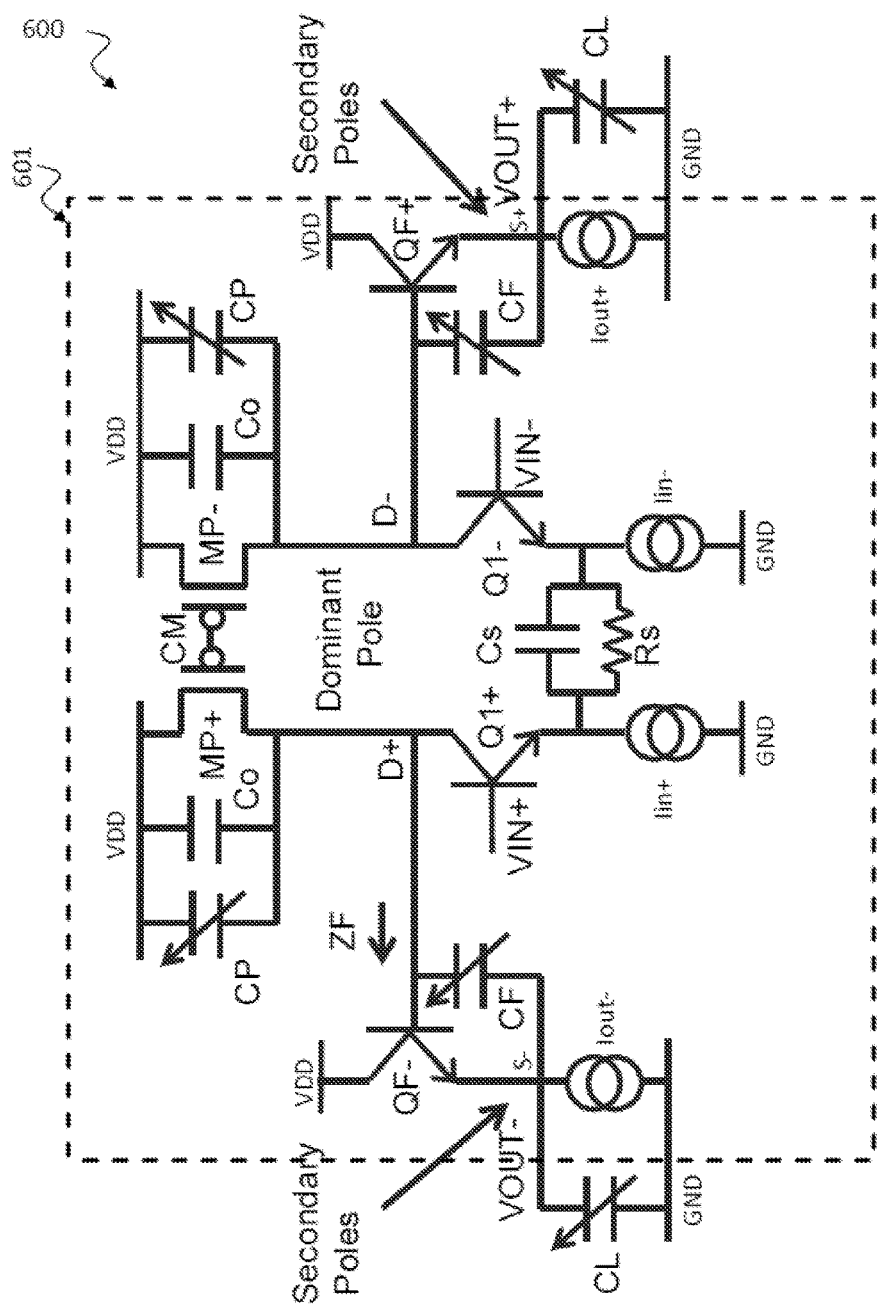
FIG. 6 shows a circuit diagram illustrating a tunable filter 600 according to a first implementation form.

FIG. 6 shows a circuit diagram illustrating a tunable filter 600 according to a first implementation form. The tunable filter 600 includes an active element 601 that may correspond to the OPAMP 101 described above with respect to FIGS. 1 to 3. In contrast to the OPAMP 101, the active element 601 additionally includes one or more stabilization elements CP, CF coupled to the internal node D+, D− for providing large gain at cutoff frequency and wide and stable tuning range as described in the following. The one or more stabilization elements may be a first pole capacitance, or a combination of capacitances and resistors.

The active element 601 includes a non-inverse input VIN+, an inverse input VIN−, a non-inverse output VOUT+ and an inverse output VOUT−. The tunable filter 600 further includes load capacitances CL coupled to the active element 601 which may correspond to the capacitances C1 and C2 as described above with respect to FIG. 1.

The active element 601 includes a non-inverse input path between a reference voltage VDD and ground GND including a first (non-inverse) current source MP+, a first (non-inverse) transistor Q1+ and a second current source (non-inverse) Iin+. A control terminal of Q1+ is coupled to the non-inverse input Vin+ of the active element 601. The active element 601 includes an inverse output path between a reference voltage VDD and ground GND including a second (inverse) transistor QF− and a third (inverse) current source Iout−. A control terminal of QF− is coupled to a first (non-inverse) node D+ of the active element 601 which is located between MP+ and Q1+. A first terminal of QF− is coupled to the inverse output VOUT− of the active element. A second terminal of QF− is coupled to the reference voltage VDD. The inverse output VOUT− of the active element 601 is coupled to a load having a (variable) load capacitance CL which determines the location of the secondary poles. The load capacitance CL is an equivalent capacitance associated to capacitance C1 and C2 of FIG. 2. The above described components are additionally used in inverse form as described in the following.

The active element 601 further includes an inverse input path between a reference voltage VDD and ground GND including a first (inverse) current source MP−, a first (inverse) transistor Q1− and a second (inverse) current source Iin−. A control terminal of Q1− is coupled to the inverse input Vin− of the active element. The active element 601 includes a non-inverse output path between a reference voltage VDD and ground GND including a second (non-inverse) transistor QF+ and a third (non-inverse) current source Iout+. A control terminal of QF+ is coupled to a first (inverse) node D− of the active element 601 which is located between MP− and Q1−. A first terminal of QF+ is coupled to the first output 121 (VOUT+) of the active element 601. A second terminal of QF+ is coupled to the reference voltage VDD. The non-inverse output VOUT+ of the active element is coupled to the load having the (variable) load capacitance CL which determines the location of the secondary poles.

A capacitance Cs and a resistor Rs are coupled in parallel between the first terminal of Q1+ and the first terminal of Q1−. A further cascode circuit may be coupled between the differential part and the non-differential part of the active element 601.

The first and/or second transistors Q1+, Q1−, QF+, QF− may be realized as bipolar transistors; in this case the control terminal is a base terminal, the first terminal is an emitter terminal and the second terminal is a collector terminal. Alternatively, the first and/or second transistors Q1+, Q1−, QF+, QF− may be realized as Field Effect transistors; in this case, the control terminal is a gate terminal, the first terminal is a source terminal and the second terminal is a drain terminal.

Note that the active element 601 can be realized as a differential active element or alternatively as a non-differential active element. The differential active element is shown in FIG. 6 while a non-differential active element comprises of half the elements as depicted in FIG. 6, i.e. one first current source MP, one first transistor Q1, one second current source Iin, one third current source Iout, one input and one output without the differentiation of non-inverse and inverse components.

A basic design of the tunable filter 600 can be described using the following words: The tunable filter 600 includes: a filter input VIN+; a filter output VOUT+; at least one feedback loop coupled between the filter output VOUT+ and the filter input VIN+, wherein the at least one feedback loop comprises at least one tunable feedback capacitance C1, C2 which is configured to tune a cut-off frequency fo of the tunable filter; and an active element 601, in particular an operational amplifier (OPAMP), coupled between the filter input and the filter output and configured to drive the at least one tunable feedback capacitance C1, C2, said active element having a transfer function with a primary pole $\omega_{p1}$ and at least one secondary pole $\omega_{p2}$, wherein the active element 601 comprises a first pole capacitance CP, CF coupled to a first internal node D+ of the active element 601, wherein the first pole capacitance CP, CF is configured to establish a linear relationship between a location of the primary pole $\omega_{p1}$ and a location of the at least one secondary pole $\omega_{p2}$ of the active element.

The location of the at least one secondary pole $\omega_{p2}$ may change with a tuning of the cut-off frequency fo of the tunable filter; and the first pole capacitance CP, CF may be configured to change the location of the primary pole $\omega_{p1}$ in accordance to the change of the at least one secondary pole $\omega_{p2}$. The first pole capacitance CP, CF may be configured to move the location of the primary pole $\omega_{p1}$ to higher frequencies when the location of the at least one secondary pole $\omega_{p2}$ is tuned to higher frequencies. The first pole capacitance CP, CF may be configured to move the location of the primary pole $\omega_{p1}$ to lower frequencies when the location of the at least one secondary pole $\omega_{p2}$ is tuned to lower frequencies. The first pole capacitance CP, CF may be a function of the at least one feedback capacitance C1, C2. The primary pole may be associated to an internal node total capacitance of the first internal node, the internal node total capacitance being proportional to the at least one feedback capacitance C1, C2. An internal node total capacitance of the first internal node D+ may be proportional to the first pole capacitance, the first pole capacitance being tunable and configured to be tuned of an amount proportional to the change of the at least one feedback capacitance C1, C2. A proportionality constant of the tuning may be a function of the first pole capacitance CF. The active element 601 may include: a first transistor Q1+ coupled between a first input terminal Vin+ and the first internal node D+ of the active element 601; and a second transistor QF− coupled between a first output terminal VOUT− and the first internal node D+ of the active element 601.

The first transistor Q1+ may include a first terminal, a second terminal and a control terminal, wherein the control terminal of Q1+ is coupled to the first input terminal VIN+ of the active element 601. The second transistor QF− may include a first terminal, a second terminal and a control terminal, wherein the first terminal of QF− is coupled to the first output terminal VOUT− of the active element. The first internal node D+ may be configured to couple the second terminal of Q1+ to the control terminal of QF−. The first pole capacitance CP may be coupled between the first internal node D+ and a reference voltage VDD. The first pole capacitance CP may be variable proportional to a change of a load capacitance CL of a load applied to the tunable filter 600.

The active element 601 may include: a first current source MP+ coupled between the first internal node D+ and a reference voltage GND; a second current source Iin coupled between the first terminal of Q1+ and a ground terminal GND; and a third current source Iout coupled between the first terminal of QF− and a ground terminal GND.

The active element 601 may be a differential voltage active element, further including: a differential first transistor Q1− coupled between a differential first input terminal VIN− and a differential first internal node D− of the active element 601; a differential second transistor QF− coupled between a differential first output terminal VOUT+ and the differential first internal node D− of the active element 601; and a differential first pole capacitance CP, CF corresponding to the first pole capacitance CP, CF, wherein the differential first pole capacitance CP, CF may be coupled to the differential first internal node D− of the active element 601.

The active element 601 may further include a cascode circuit coupled between the second terminal of Q1+ and the second terminal of Q1−.

The above described active element 601 (e.g. OPAMP) may be used in a filter with variable operating frequency fo. The tuning of the frequency fo may be performed by changing its capacitances and this change can be modeled (in its simplest form) as a change in the capacitance CL at the output VOUT. The change of capacitance CL moves locations of secondary poles located at nodes VOUT. The tunable filter 600 according to the disclosure includes the following features: (i) the addition of capacitances CP and/or CF and (ii) a method to vary CP and/or CF of an amount proportional to the change of CL. Different examples can be derived from the tunable filter 600 by applying the following restrictions: (a) CP is variable and CF is fixed, (b) CP is variable and no CF is used, (c) no CP is used and fixed CF is used, (d) no CP is used and variable CF is used.

The basic principle of the disclosure is described in the following. The input impedance at the base of the voltage follower (the capacitance associated to this node contributes to the capacitance of the primary pole of the OPAMP) can be written as:

$$ZF(s) = \frac{1}{s \cdot (C_\pi + C_F)} + \frac{1}{s \cdot C_L} + \frac{1}{s^2 \cdot C_L \cdot (C_\pi + C_F) \cdot g_m(QF)},$$

where $C_\pi$ is the base-emitter capacitance of the Bipolar (or alternatively FET) transistor QF and gm(QF) is its transconductance.

The above equation shows that 1) ZF has a negative real part. This is due to simplification of modeling all feedback loops with a single capacitance CL and is not relevant hereinafter. The input capacitance (that contributes to the capacitance of the primary pole) is a function of CL and CF.

If capacitance CP is also taken into account, the total capacitance at the node D (i.e. the primary pole capacitance) can be written as:

$$C_D = C_o + C_P + \frac{(C_\pi + C_F) \cdot C_L}{C_\pi + C_F + C_L}.$$

The above equation can be analyzed in following two cases resulting in the second and third implementation forms as described below with respect to FIGS. 7 and 8.

Figure 7:
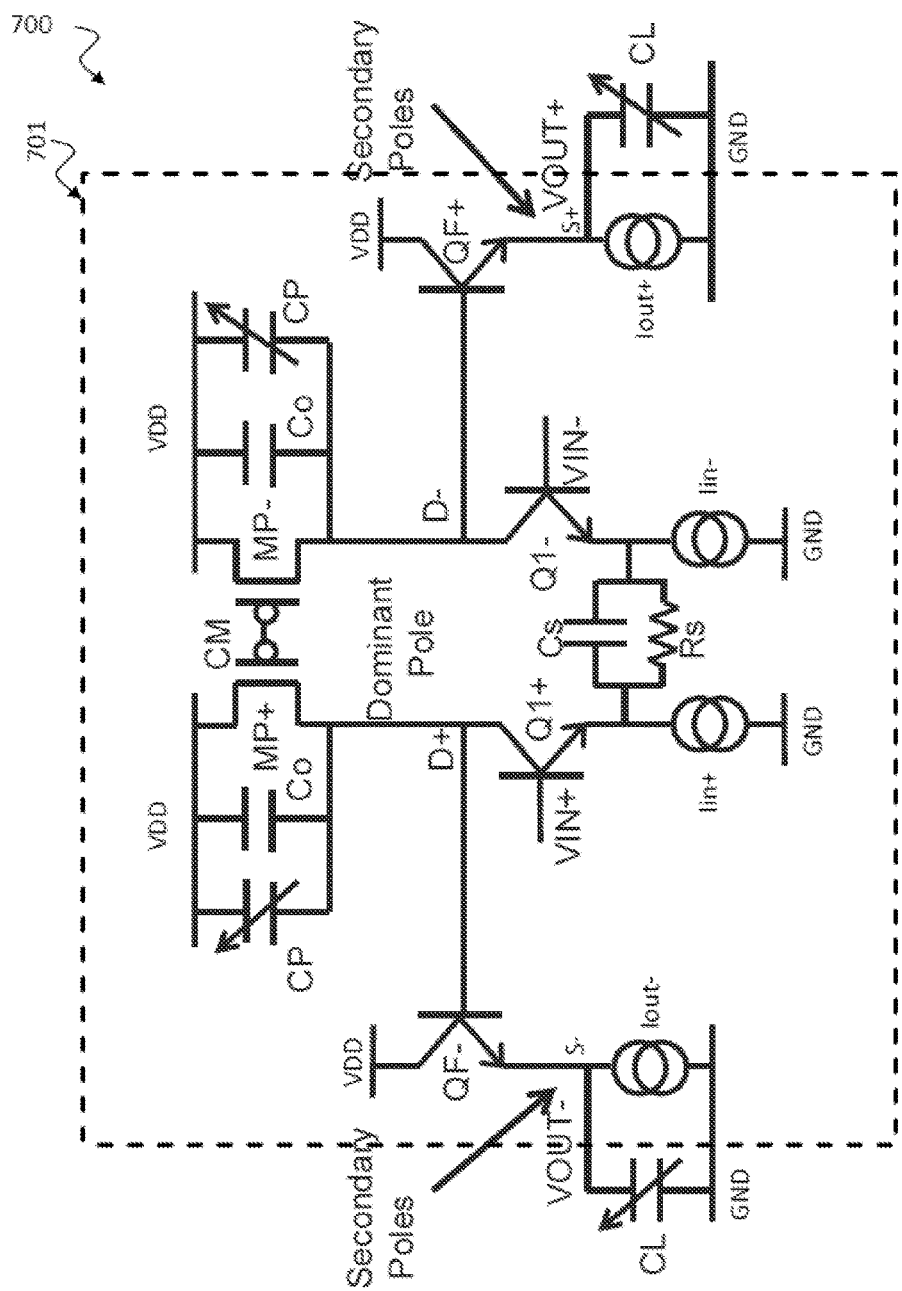
FIG. 7 shows a circuit diagram illustrating a tunable filter 700 according to a second implementation form.

FIG. 7 shows a circuit diagram illustrating a tunable filter 700 according to a second implementation form.

The tunable filter 700 corresponds to the tunable filter 600 described above with respect to FIG. 6; however the active element 701 of the tunable filter 700 does not include the stabilization element CF, instead only the stabilization element CP is implemented.

This corresponds to the implementation of no CF and low input capacitance voltage follower, i.e.: $C_F=0$ $C_\pi<<C_P$. In this case $C_D=C_P+C_o$ and the tracking of the primary pole can be done by varying CP of the same amount as CL.

Figure 8:
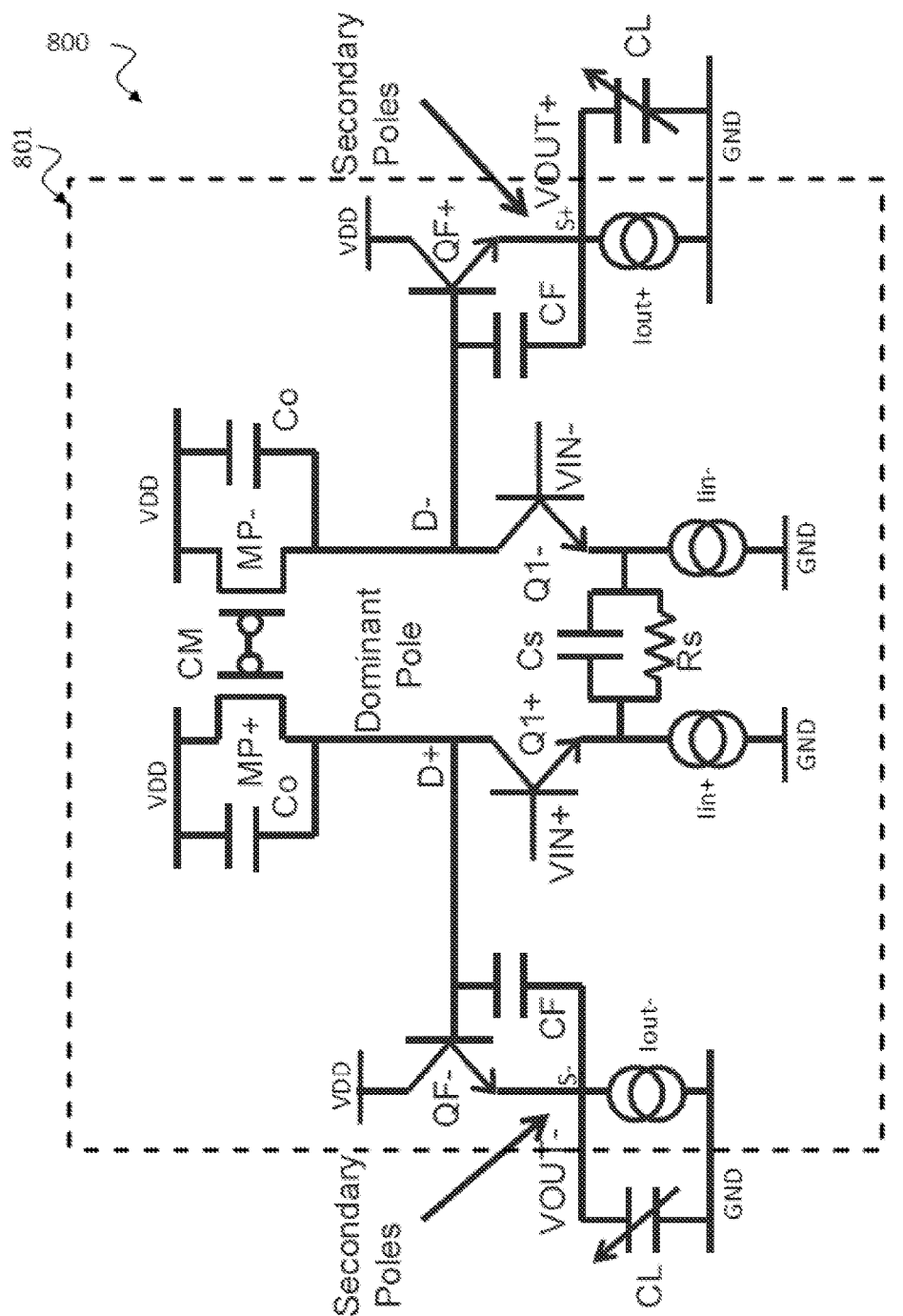
FIG. 8 shows a circuit diagram illustrating a tunable filter 800 according to a third implementation form.

FIG. 8 shows a circuit diagram illustrating a tunable filter 800 according to a third implementation form.

The tunable filter 800 corresponds to the tunable filter 600 described above with respect to FIG. 6; however the active element 801 of the tunable filter 800 does not include the stabilization element CP, instead only the stabilization element CF is implemented.

This corresponds to the implementation of a fixed value according to $C_F$ and $C_P=0$. In this case the following relation holds:

$$C_D = C_o + \frac{(C_\pi + C_F) \cdot C_L}{C_\pi + C_F + C_L}.$$

If $C_\pi + C_F = C_L$, then $C_D = C_o + \frac{C_L}{2}$.

The above equation shows that the capacitance at the primary pole is proportional to CL, i.e. when CL changes, same change is applied to CD.

The three implementation forms 600, 700, 800 show the following advantages of the disclosed tunable filter: Since the primary pole is not limited by maximum load capacitance, very large GBW can be achieved when load capacitance is low (i.e. filter is programmed to fo_max). This allows to implement a filter with closed loop approach at fo>700-MHz in an exemplary implementation. At very large fo, G_OPAMP cannot be very high to consider it infinite. The filter shape (i.e. its quality factor) will depend upon G_OPAMP. Since the primary pole is programmable the following relation holds: G_OPAMP(fo_max)=G_OPAMP (fo_min). Since G_OPAMP is more stable across filter tuning range, filter response (i.e. Quality factor of filter) may be more uniform across the tuning range.

The disclosed tunable filter designs can be used for all filter with very large tuning range or any closed loop systems with very large different loading capacitances.

Figure 9:
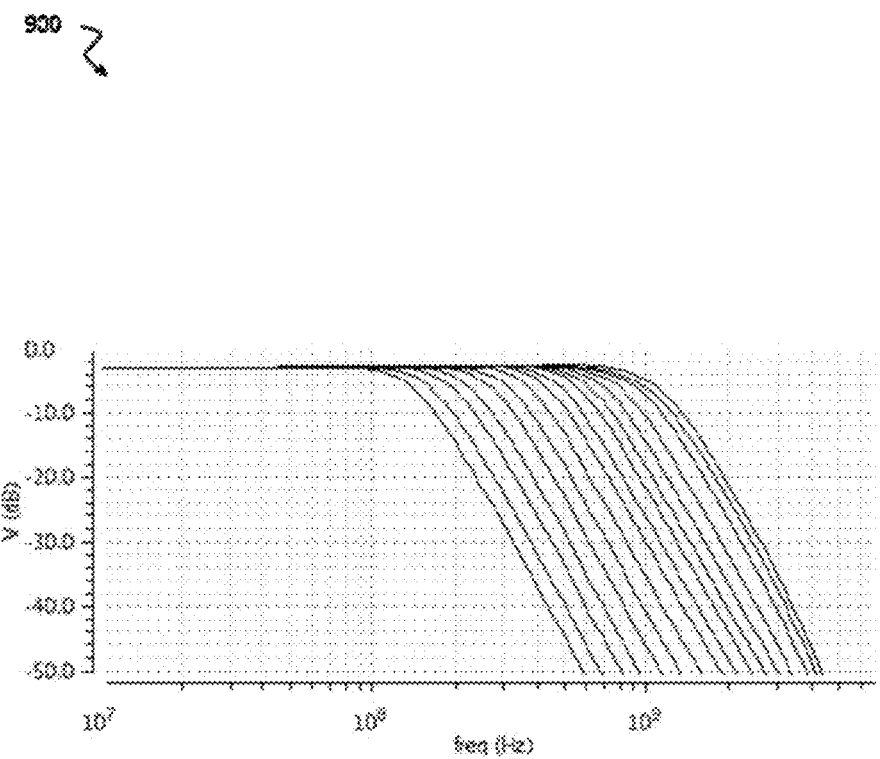
FIG. 9 shows a performance diagram 900 illustrating a tuning range for a tunable filter according to the disclosure.

FIG. 9 shows a performance diagram 900 illustrating a tuning range for a tunable filter according to the disclosure.

The tunable filter has been realized with a $4^{th}$ order Low Pass Filter (LPF) with a 1 GHz Bandwidth. Performances are shown in FIG. 9. The filter achieves 90-700 MHz 1 dB Bandwidth tuning range. With such large tuning range, the disclosed tunable filter using adaptive stability compensation allows to have 10 GHz Gain*Bandwidth product with 60 degree phase margin and a filter that operates between 90-700 MHz.

Figure 10:
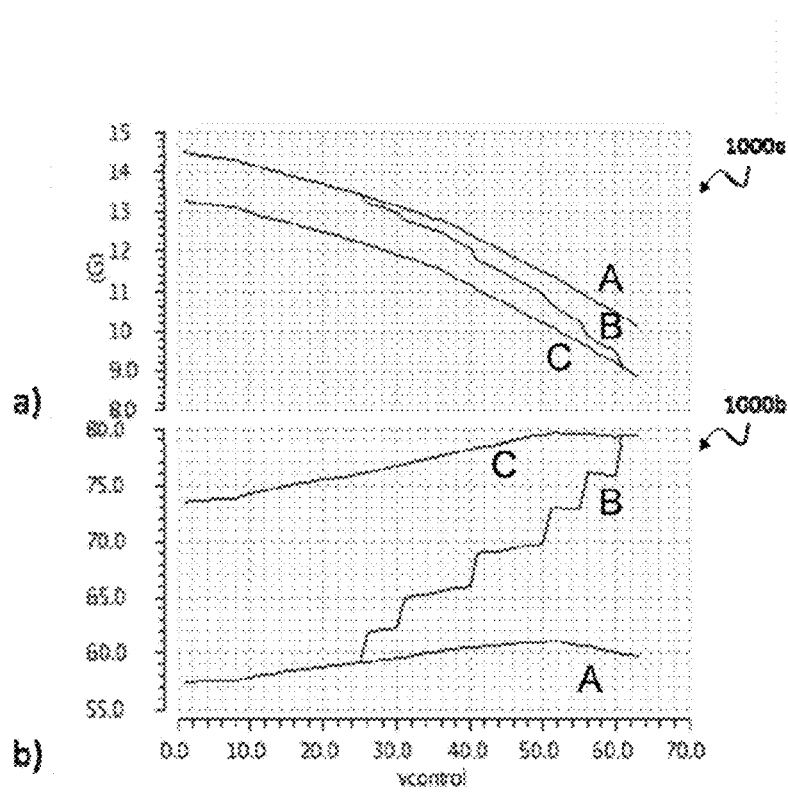
FIG. 10 shows performance diagrams 1000*a*, 1000*b* illustrating OPAMP cross-over frequency and phase margin for a tunable filter according to the disclosure.

FIG. 10 shows performance diagrams 1000a, 1000b illustrating OPAMP cross-over frequency and phase margin for a tunable filter according to the disclosure.

BGW 1000a and Phase Margin 1000b of the OPAMP used in the tunable filter according to the disclosure are depicted for the following three cases: (A): Fixed CF, CP=0; (B): Fixed CF and variable CP; (C): fixed CF and CP set at maximum value. The A case yields good results, i.e. the phase margin is kept almost constant across the complete tuning range. The B-case yields the best result in terms of phase margin, i.e. phase margin is improved when operating frequency is reduced. The C-case is reported as a reference and can be useful in case that a maximum phase margin is needed, regardless of the bandwidth achieved.

According to a first aspect, the disclosure relates to a tunable filter, comprising: a filter input; a filter output; at least one feedback loop coupled between the filter output and the filter input, wherein the at least one feedback loop comprises at least one tunable feedback capacitance which is configured to tune a cut-off frequency of the tunable filter; and an active element, in particular an operational amplifier, coupled between the filter input and the filter output and configured to drive the at least one tunable feedback capacitance, said active element having a transfer function with a primary pole $\omega_{p1}$ and at least one secondary pole $\omega_{p2}$, wherein the active element comprises a first stabilization element, in particular a first pole capacitance coupled to a first internal node of the active element, wherein the first stabilization element is configured to establish a linear relationship between a location of the primary pole $\omega_{p1}$ and a location of the at least one secondary pole $\omega_{p2}$ of the active element.

By establishing a linear relationship between a location of the primary pole $\omega_{p1}$ and a location of the at least one secondary pole $\omega_{p2}$, the tunable filter provides the advantage of large gain at cutoff frequency and wide and stable tuning range, since the primary pole is not limited by the maximum load capacitance. A large GBW can be achieved when load capacitance is low which allows implementing filter with closed loop approach at high cutoff frequency, e.g. 700 MHz and higher.

In a first possible implementation form of the tunable filter according to the first aspect, the location of the at least one secondary pole $\omega_{p2}$ changes with a tuning of the cut-off frequency (fo) of the tunable filter; and the first stabilization element is configured to change the location of the primary pole $\omega_{p1}$ in accordance to the change of the at least one secondary pole $\omega_{p2}$.

This provides the advantage that due to the linear relationship of the location of the primary pole and the secondary poles $\omega_{p2}$, the tunable filter provides the advantage of large gain at cutoff frequency and wide and stable tuning range, since the primary (i.e. primary) pole is not limited by the maximum load capacitance.

In a second possible implementation form of the tunable filter according to the first aspect as such or according to the first implementation form of the first aspect, the first stabilization element is configured to move the location of the primary pole $\omega_{p1}$ to higher frequencies when the location of the at least one secondary pole $\omega_{p2}$ is tuned to higher frequencies.

This provides the advantage that due to the linear relationship of the location of the primary pole and the secondary poles $\omega_{p2}$, the filter gain is stable across the whole filter tuning range.

In a third possible implementation form of the tunable filter according to the first aspect as such or according to any of the preceding implementation forms of the first aspect, the first stabilization element is configured to move the location of the primary pole $\omega_{p1}$ to lower frequencies when the location of the at least one secondary pole $\omega_{p2}$ is tuned to lower frequencies.

This provides the advantage of large GBW when load capacitance is low.

In a fourth possible implementation form of the tunable filter according to the first aspect as such or according to any of the preceding implementation forms of the first aspect, the first stabilization element is a function of the at least one feedback capacitance.

When the first stabilization element is a function of the at least one feedback capacitance, the filter shows improved stability.

In a fifth possible implementation form of the tunable filter according to the first aspect as such or according to any of the preceding implementation forms of the first aspect, the primary pole is associated to an internal node total capacitance of the first internal node, the internal node total capacitance being proportional to the at least one feedback capacitance.

Such a proportionality results in improved stability at high tuning ranges.

In a sixth possible implementation form of the tunable filter according to the third implementation form of the first aspect, an internal node total capacitance of the first internal node is proportional to the first stabilization element, the first stabilization element being tunable and configured to be tuned of an amount proportional to the change of the at least one feedback capacitance.

When the first stabilization element is tunable and tuned of an amount proportional to the change of the feedback capacitance, optimal performance tuning ranges of the filter can be easily adjusted.

In a seventh possible implementation form of the tunable filter according to the sixth implementation form of the first aspect, a proportionality constant of the tuning is a function of the first stabilization element.

This provides the advantage of better stability, as the stability condition depends on a quotient of the location of the second poles and the location of the first pole. A proportionality relaxes the stability condition.

In an eighth possible implementation form of the tunable filter according to the first aspect as such or according to any of the preceding implementation forms of the first aspect, the active element comprises: a first transistor coupled between a first input terminal and the first internal node of the active element; and a second transistor coupled between a first output terminal and the first internal node of the active element.

In a ninth possible implementation form of the tunable filter according to the eighth implementation form of the first aspect, the first transistor comprises a first terminal, a second terminal and a control terminal, wherein the control terminal of the first transistor is coupled to the first input terminal of the active element, wherein the second transistor comprises a first terminal, a second terminal and a control terminal, wherein the first terminal of the second transistor is coupled to the first output terminal of the active element; and wherein the first internal node is configured to couple the second terminal of the first transistor to the control terminal of the second transistor.

This provides the advantage that the filter design can be flexibly implemented, e.g. by two bipolar transistors or by two FET transistors.

In a tenth possible implementation form of the tunable filter according to the ninth implementation form of the first aspect, the first stabilization element is coupled between the first internal node and a reference voltage.

This provides the advantage that the first stabilization element can be easily implemented by introducing a capacitive coupling between the first internal node and the reference voltage.

In an eleventh possible implementation form of the tunable filter according to the ninth implementation form of the first aspect, the first stabilization element is variable proportional to a change of a load capacitance of a load applied to the tunable filter.

This provides the advantage that due to the proportionality the stability condition holds for large gains and broad tuning ranges.

In a twelfth possible implementation form of the tunable filter according to any of the eighth to the eleventh implementation forms of the first aspect, the active element comprises: a first current source coupled between the first internal node and a reference voltage; a second current source coupled between the first terminal of the first transistor and a ground terminal; and a third current source coupled between the first terminal of the second transistor and a ground terminal.

This provides the advantage that these current sources can be flexibly designed, for example by transistors.

In a thirteenth possible implementation form of the tunable filter according to any of the eighth to the twelfth implementation forms of the first aspect, the active element is a differential voltage active element, further comprising: a differential first transistor coupled between a differential first input terminal and a differential first internal node of the active element; a differential second transistor coupled between a differential first output terminal and the differential first internal node of the active element; and a differential first stabilization element corresponding to the first stabilization element, wherein the differential first stabilization element is coupled to the differential first internal node of the active element.

This provides the advantage that a differential design is of higher quality and shows improved linearity.

In a fourteenth possible implementation form of the tunable filter according to the thirteenth implementation form of the first aspect, the active element further comprises: a cascode circuit coupled between the second terminal of the first transistor and the second terminal of the differential first transistor.

A cascode circuit provides the advantage of decoupling of the inverse and non-inverse parts resulting in improved linearity and stability.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Those skilled in the art readily recognize that there are numerous applications of the disclosure beyond those described herein. While the present disclosure has been described with reference to one or more particular examples, those skilled in the art recognize that many changes may be made thereto without departing from the scope of the present disclosure. It is therefore to be understood that within the scope of the appended claims and their equivalents, the disclosure may be practiced otherwise than as specifically described herein.

The invention claimed is:

1. A tunable filter comprising:
   a filter input;
   a filter output;
   at least one feedback loop coupled between the filter output and the filter input, wherein the at least one feedback loop comprises at least one tunable feedback capacitance which is configured to tune a cut-off frequency of the tunable filter; and an active element coupled between the filter input and the filter output and configured to drive the at least one tunable feedback capacitance, said active element having a transfer function with a primary pole and at least one secondary pole, wherein the active element comprises a first stabilization element that is coupled to a first internal node of the active element, wherein the first stabilization element is configured to establish a linear relationship between a location of the primary pole and a location of the at least one secondary pole of the active element.

2. The tunable filter of claim 1, wherein:

the location of the at least one secondary pole changes with a tuning of the cut-off frequency of the tunable filter; and the first stabilization element is configured to change the location of the primary pole in accordance to the change of the at least one secondary pole.

3. The tunable filter of claim 1, wherein the first stabilization element is configured to move the location of the primary pole to higher frequencies when the location of the at least one secondary pole is tuned to higher frequencies.

4. The tunable filter of claim 1, wherein the first stabilization element is configured to move the location of the primary pole to lower frequencies when the location of the at least one secondary pole is tuned to lower frequencies.

5. The tunable filter of claim 1, wherein the first stabilization element is a function of the at least one feedback capacitance.

6. The tunable filter of claim 1, wherein the primary pole is associated to an internal node total capacitance of the first internal node, and the internal node total capacitance is proportional to the at least one feedback capacitance.

7. The tunable filter of claim 4, wherein an internal node total capacitance of the first internal node is proportional to a capacitance of the first stabilization element, and the capacitance of the first stabilization element is tunable and is configured to be tuned of an amount proportional to the change of the at least one feedback capacitance.

8. The tunable filter of claim 7, wherein a proportionality constant of the tuning is a function of the capacitance of the first stabilization element.

9. The tunable filter of claim 1, wherein the active element comprises:

a first transistor coupled between a first input terminal and the first internal node of the active element; and a second transistor coupled between a first output terminal and the first internal node of the active element.

10. The tunable filter of claim 9, wherein:

the first transistor comprises a first terminal, a second terminal and a control terminal, and wherein the control terminal of the first transistor is coupled to the first input terminal of the active element, the second transistor comprises a first terminal, a second terminal and a control terminal, and wherein the first terminal of the second transistor is coupled to the first output terminal of the active element; and the first internal node is configured to couple the second terminal of the first transistor to the control terminal of the second transistor.

11. The tunable filter of claim 10, wherein the first stabilization element is coupled between the first internal node and a reference voltage.

12. The tunable filter of claim 10, wherein the first stabilization element is variable proportional to a change of a load capacitance of a load applied to the tunable filter.

13. The tunable filter of claim 9, wherein the active element comprises:

a first current source coupled between the first internal node and a reference voltage;

a second current source coupled between the first terminal of the first transistor and a ground terminal; and a third current source coupled between the first terminal of the second transistor and a ground terminal.

14. The tunable filter of claim 9, wherein the active element is a differential voltage active element, and the active element further comprises:

a differential first transistor coupled between a differential first input terminal and a differential first internal node of the active element;

a differential second transistor coupled between a differential first output terminal and the differential first internal node of the active element; and a differential first stabilization element corresponding to the first stabilization element, wherein the differential first stabilization element is coupled to the differential first internal node of the active element.

15. The tunable filter of claim 14, wherein the active element further comprises:

a cascode circuit coupled between the second terminal of the first transistor and the second terminal of the second transistor.

16. An apparatus comprising a tunable filter, wherein the tunable filter comprises:

a filter input;

a filter output;

at least one feedback loop coupled between the filter output and the filter input, wherein the at least one feedback loop comprises at least one tunable feedback capacitance which is configured to tune a cut-off frequency of the tunable filter; and an active element, coupled between the filter input and the filter output and configured to drive the at least one tunable feedback capacitance, said active element having a transfer function with a primary pole and at least one secondary pole, wherein the active element comprises a first stabilization element that is coupled to a first internal node of the active element, wherein the first stabilization element is configured to establish a linear relationship between a location of the primary pole and a location of the at least one secondary pole of the active element.

17. The apparatus of claim 16, wherein:

the location of the at least one secondary pole changes with a tuning of the cut-off frequency of the tunable filter; and the first stabilization element is configured to change the location of the primary pole in accordance to the change of the at least one secondary pole.

18. A method of making a tunable filter comprising:

providing a filter input, and a filter output;

connecting at least one feedback loop between the filter output and the filter input, wherein the at least one feedback loop comprises at least one tunable feedback capacitance which is configured to tune a cut-off frequency of the tunable filter; and connecting an active element between the filter input and the filter output, wherein the active element is configured to drive the at least one tunable feedback capacitance, and the active element has a transfer function with a primary pole and at least one secondary pole, wherein the active element comprises a first stabilization element that is coupled to a first internal node of the active element, wherein the first stabilization element is configured to establish a linear relationship between a location of the primary pole and a location of the at least one secondary pole of the active element.

19. The method of claim 18, wherein the active element comprises:

a first transistor coupled between a first input terminal and the first internal node of the active element; and a second transistor coupled between a first output terminal and the first internal node of the active element.

20. The method of claim 19, wherein:

the first transistor comprises a first terminal, a second terminal and a control terminal, and wherein the control terminal of the first transistor is coupled to the first input terminal of the active element, the second transistor comprises a first terminal, a second terminal and a control terminal, and wherein the first terminal of the second transistor is coupled to the first output terminal of the active element; and the first internal node is configured to couple the second terminal of the first transistor to the control terminal of the second transistor.

* * * * *

UNITED STATES PATENT AND TRADEMARK OFFICE
CERTIFICATE OF CORRECTION

PATENT NO. : 10,211,811 B2  
APPLICATION NO. : 15/906791  
DATED : February 19, 2019  
INVENTOR(S) : Gramegna Page 1 of 1

It is certified that error appears in the above-identified patent and that said Letters Patent is hereby corrected as shown below:

On the Title Page

Item [30], "EP 077319 A1 6/1996" should read -- EP 0777319 A1 6/1997 --.

Signed and Sealed this
Eighteenth Day of February, 2020

Andrei Iancu
*Director of the United States Patent and Trademark Office*